(12) United States Patent
Youndt et al.

(10) Patent No.: US 11,349,993 B2
(45) Date of Patent: May 31, 2022

(54) METHOD AND APPARATUS FOR INTERFACING ANALOG PAGE PARTY SYSTEM TO INTERNET PROTOCOL PAGE PARTY SYSTEM

(71) Applicant: Hubbell Incorporated, Shelton, CT (US)

(72) Inventors: Keith Youndt, Pottstown, PA (US); Alec Mercer, New Holland, PA (US)

(73) Assignee: Hubbell Incorporated, Shelton, CT (US)

( * ) Notice: Subject to any disclaimer, the term of this patent is extended or adjusted under 35 U.S.C. 154(b) by 136 days.

(21) Appl. No.: 16/742,126

(22) Filed: Jan. 14, 2020

(65) Prior Publication Data

US 2020/0228661 A1 Jul. 16, 2020

Related U.S. Application Data

(60) Provisional application No. 62/792,537, filed on Jan. 15, 2019.

(51) Int. Cl.
 *H04M 3/56* (2006.01)
 *H04M 1/253* (2006.01)
 (Continued)

(52) U.S. Cl.
 CPC ......... *H04M 3/568* (2013.01); *H03M 1/0626* (2013.01); *H04M 1/2535* (2013.01); *H04M 7/0069* (2013.01); *H04M 7/0084* (2013.01)

(58) Field of Classification Search
 CPC .. H04M 3/568; H04M 1/2535; H04M 7/0084; H04M 7/0069; H04M 11/022;
 (Continued)

(56) References Cited

U.S. PATENT DOCUMENTS 6,654,455 B1 * 11/2003 Isaka .................. H04L 12/1827
370/261
8,059,798 B1 * 11/2011 Skubisz ................ H04L 65/103
379/112.02

(Continued)

OTHER PUBLICATIONS

International Search Report and Written Opinion dated Apr. 14, 2020, which issued in the corresponding PCT Patent Application No. PCT/US2020/13042.

*Primary Examiner* — Steven H Nguyen
(74) *Attorney, Agent, or Firm* — Dickinson Wright PLLC

(57) ABSTRACT

An audio bridge unit is provided for connecting a conventional analog page/party station in an analog page/party system to IP-based page/party stations that employ multicast Voice over Internet Protocol (VoIP) technology to support page/party communications between analog page/party stations and the VoIP page/party stations. The audio bridge unit converts page and/or party audio line(s) to multicast channel(s). The audio bridge unit analog interfaces for its respective page and/or party lines, and each analog interface is assigned to an independent multicast channel on which it will transmit and receive full duplex audio between an analog page/party station and one or more IP-based page/party stations. The audio bridge unit provides the ability to configure the multicast group, port and Time to Live (TTL) setting for each of the analog channels associated with the page and/or party lines.

17 Claims, 9 Drawing Sheets

(51) Int. Cl.
*H03M 1/06* (2006.01)
*H04M 7/00* (2006.01)

(58) Field of Classification Search
CPC ...... H04M 7/125; H04M 7/1205; H04M 3/16; H04M 2203/658; H03M 1/0626
See application file for complete search history.

(56) References Cited

U.S. PATENT DOCUMENTS

| | | | |
|---|---|---|---|
| 2002/0009073 A1* | 1/2002 | Furukawa | H04L 65/1069 370/352 |
| 2006/0067302 A1* | 3/2006 | Wengrovitz | H04M 1/2535 370/352 |
| 2009/0263139 A1* | 10/2009 | Liu | H04L 65/1026 398/135 |
| 2010/0189018 A1* | 7/2010 | Chu | H04Q 11/0428 370/261 |
| 2011/0075669 A1* | 3/2011 | Punj | H04L 65/104 370/395.1 |
| 2013/0163409 A1* | 6/2013 | Ellison | H04L 61/2007 370/221 |
| 2014/0156768 A1* | 6/2014 | Arjunan | H04W 4/90 709/206 |
| 2015/0030018 A1 | 1/2015 | Brand et al. | |
| 2015/0063192 A1 | 3/2015 | Zukas et al. | |
| 2016/0269113 A1* | 9/2016 | Jovicic | H04B 10/11 |
| 2017/0366672 A1 | 12/2017 | Newman et al. | |

* cited by examiner

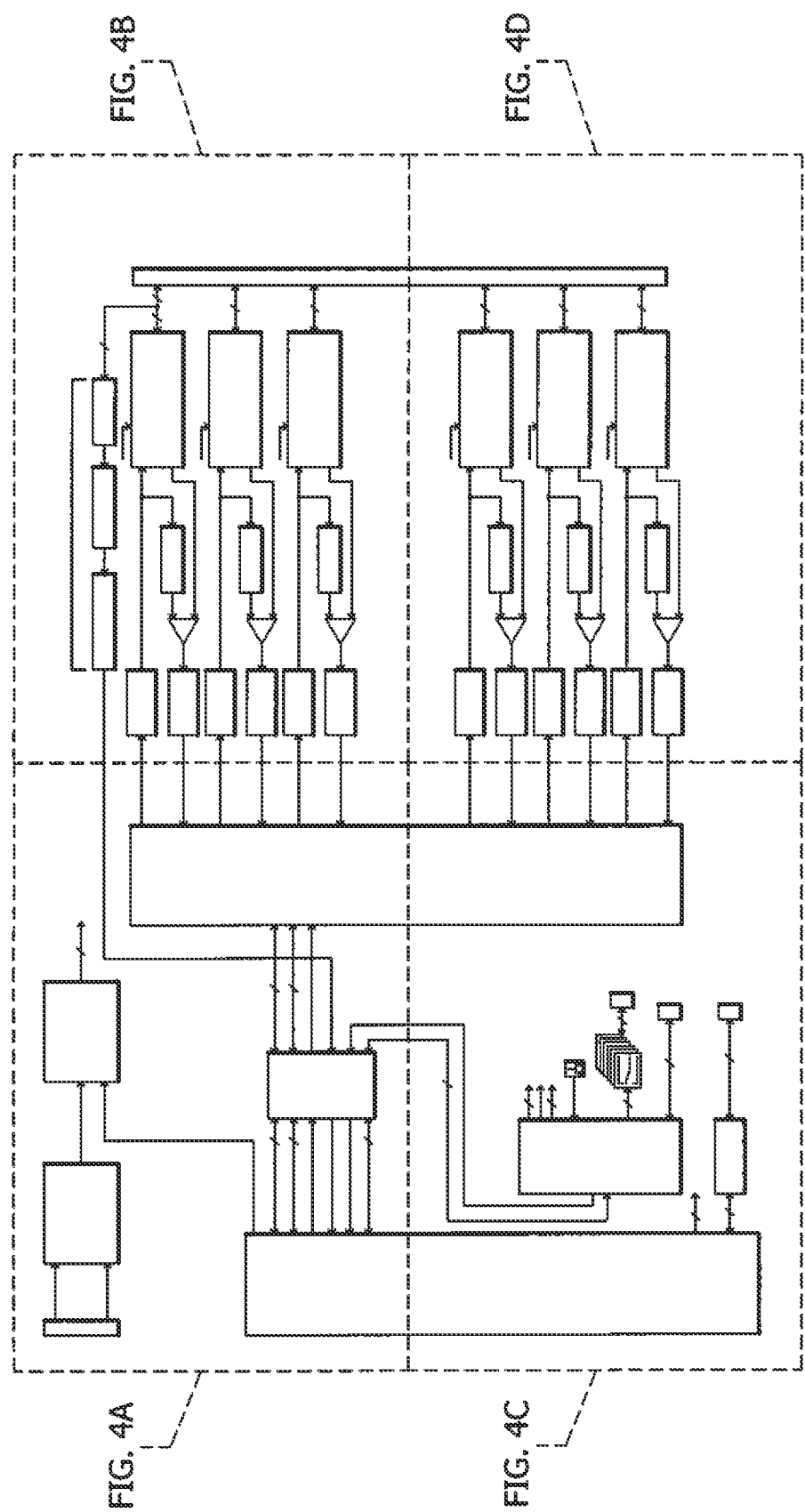

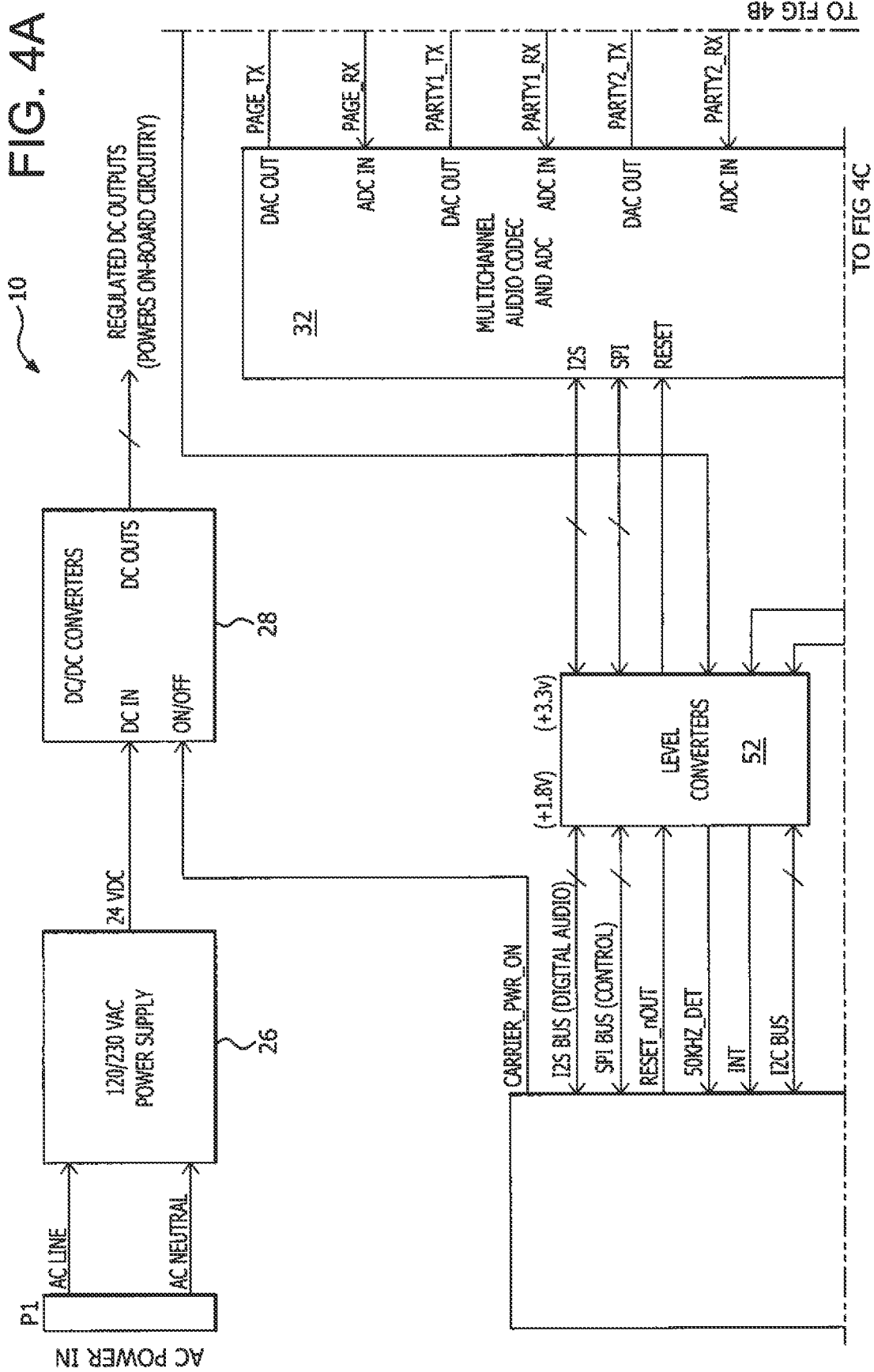

METHOD AND APPARATUS FOR INTERFACING ANALOG PAGE PARTY SYSTEM TO INTERNET PROTOCOL PAGE PARTY SYSTEM

This application claims the benefit of provisional application Ser. No. 62/792,537, filed Jan. 15, 2019, the entire contents of which are incorporated herein by reference.

BACKGROUND

Field

The technical solutions described herein relate to an interface between. Internet Protocol or IP-based page/party units or stations and analog page/party units or stations.

Description of Related Art

Conventional page/party systems can comprise page/party stations or units deployed in various locations at a facility (e.g., an industrial plant). These conventional page/party stations are configured to permit users to lift a station handset and depress a page button to make an announcement or page via public address (PA) speakers. The page/party stations are also configured to allow multiple users at respective stations to engage in conversation on one or more party lines without being heard over the speakers. GAI-Tronics Corporation in Reading, Pa. produces a number of different models of conventional legacy page/party stations and industrial communication system (ICS) equipment such as, but not limited to, the indoor or outdoor page/party wall stations model nos. 7005.102 and 7305-107.

Because page party operations require a single line per channel, page party stations in legacy page/party systems are wired in parallel. Cabling in these legacy page/party systems can therefore be costly and cumbersome. For example, the more page or party lines required for an installation and the greater the distance between the page/party stations, the greater the cost of cabling. Where traditional telephones can contact multiple endpoints (e.g., with the aid of an exchange) over a single physical line, a page party system requires a single line per channel, resulting in a large bundle of wires being connected to each page/party station.

GAI-Tronics Corporation offers a number of page party stations that employ multicast Voice over Internet Protocol (VoIP) technology for achieving page/party operations. Example VoIP stations are described in commonly-owned WO/2015/031624 incorporated by reference herein. GAI-Tronics Corporation produces a number of different models of IP-based page/party stations such as, but not limited to, SP2 VoIP multicast paging and intercom stations module nos. 915-121S1 (indoor), 925-121S1 (outdoor) and 925-12105 (hazardous area). These IP-based stations are connected to a network via a single cable (e.g., an Ethernet cable such as a Cat 5 cable or fiber optic cable) in a star configuration, and route packets between each other via multicast technology to achieve page/party operations, thereby obviating the cumbersome cabling in a daisy chain that is associated with the aforementioned legacy page/party stations. An IP-based station 16 can operate as a VoIP telephone by determining that a SIP server/IP PBX is available and undergoing registration. Some example operations of a VoIP telephone are described in WO/2015/031624. For example, the IP-based station is configured with a dedicated SIP address. With its IP connectivity and loudspeaker, the IP-based station can enable point-to-point calling and have a "ring" tone generated to the loudspeaker, for example, for point-to-point calls to its dedicated SIP address, as well as support the afore-mentioned page and party line operations.

GAI-Tronics Corporation also provides a serverless page party (SPP, or hereinafter "SP2") system for intelligent intra-facility communications and emergency notifications. For example, an SP2 system configures IP-based stations to allow users to send announcements and emergency notifications throughout a facility or to select paging zone(s), and to participate in a full-duplex manner on an intercom party line. An SP2 system is a paging and intercom system that combines the simplicity of "press to page, release to party" operation with multicast Voice over Internet Protocol (VoIP) technology. An SP2 system provides virtually instant communication in the most demanding of environments such a designated hazardous area (HA). An SP2 system and IP-based stations configured for SP2 operations are currently available from GAI-Tronics Corporation, and are described in commonly-owned WO 2016/100795 incorporated by reference herein. Examples include, but are not limited to, the SP2 Indoor Handset/Speaker Station 915-141S100. An SP2 system is a serverless system. In other words, while other paging and intercom systems rely on servers to route calls and administrate the system calls, SP2 uses multicast technology, obviating the need for servers in addition to improving speed, simplicity, reliability, and ease of installation.

In an SP2 system, IP-based stations are configured with IP addresses for point-to-point calls as well as multicast addresses of page and party line sockets, thereby eliminating the need for employing a SIP server or IP-PBX to connect to each other. Since the need for a conference bridge and the additional time needed to set up a conference in older systems is obviated by IP-based stations configured in this manner, and since multicast is instantaneously available on a party line, the IP-based stations in an SP2 system are advantageous because they are essentially real-time operational.

SUMMARY

Advantages are realized by illustrative embodiments of the technical solutions described herein that provide an interface between Internet-Protocol (IP)-based page/party stations and analog page/party stations.

In accordance with illustrative embodiments, an audio bridge unit is provided to connect an analog page/party station to one or more Internet-Protocol (IP)-based page/party stations. The audio bridge unit comprises: (a) an analog telephone interface, the analog page/party station being configured to receive and transmit analog audio on a one or more analog audio lines chosen from a page line and a party line, the analog telephone interface comprising an analog audio line interface for each of the one or more analog lines; (b) an Ethernet interface, the one or more IP-based stations being connected via an Ethernet link and configured to receive and transmit digital audio on multicast channels corresponding the one or more analog lines, the Ethernet interface being configured to connect to the Ethernet link; (c) a memory device, the memory device comprising configuration data, the configuration data comprising multicast channel parameters, the multicast channel parameters designating respective ones of the multicast channels for corresponding ones of the one or more analog audio lines; and (d) a processor device configured to process received analog audio from the one or more analog audio lines at the analog page/party station into digital audio transmit signals and transmit the digital audio transmit signals to one or more of the IP-based stations via corresponding ones of the multicast channels in accordance with the configuration data, and to process received digital audio from the multicast channels into analog audio transmit signals and transmit the analog audio transmit signals to the corresponding ones of the one or more analog audio lines of the analog page/party station in accordance with the configuration data.

In accordance with aspects of illustrative embodiments, the audio bridge unit further comprises a conversion device for each of the one or more analog audio lines, the conversion device being configured to be connected between a corresponding one of the one or more analog audio lines, and one of the processor device and a coder-decoder (codec) connected to the processor device, the conversion device being configured to convert the received analog audio from the one or more analog audio lines into digital audio signals, the processor device being configured to provide the digital audio signals to corresponding multicast channels.

In accordance with aspects of illustrative embodiments, the conversion device comprises: (a) at least one isolation device connected to a corresponding one of the one or more analog audio lines; (b) an amplifier and an analog-to-digital (ADC) filter connected to the isolation device and configured to receive analog audio signals therefrom and convert them into digital audio signals for transmission to at least one IF-based page/party station; and (c) a digital-to-analog (DAC) filter connected to the isolation device and configured to convert digital audio signals received from at least one IP-based page/party station into analog audio signals and provide the analog audio signals to the isolation device. For example, the DAC filter in each conversion device is connected to the codec.

In accordance with aspects of illustrative embodiments, the audio bridge unit further comprises status indicators, and the processor device is configured to operate the status indicators to indicate status of respective Ethernet connections of the one or more IP-based stations connected via the Ethernet link.

In accordance with aspects of illustrative embodiments, the configuration data comprises, for each of the one or more analog audio lines, at least one of a designated multicast group, a designated multicast port, a selected time to live (TTL) setting, analog audio threshold level to be exceeded before analog audio signals are processed into digital audio signals, a VLC enabled parameter, isolate input enabled parameter, channel direction designation, and channel name.

In accordance with aspects of illustrative embodiments, the processor device is configured to process digital audio signals in multicast streams from a plurality of IP-based page/party stations simultaneously for respective ones of the one or more analog audio lines. In addition, the processor device is configured to prevent transmission of analog audio signals from a respective one of the one or more analog audio lines to one or more IP-based page/party stations if a designated number of received multicast streams is exceeded.

In accordance with aspects of illustrative embodiments, the processor device is configured to detect when a multicast stream is being received from one or more of the IP-based page/party stations, generate an off-hook input signal, and provide the off-hook input signal to a corresponding one of the one or more analog audio lines in accordance with the configuration data.

In accordance with aspects of illustrative embodiments, the processor device is connected to at least one relay contact output corresponding to one of the one or more analog audio lines, the processor device is configured to activate the relay contact output upon detection of a digital audio signal on the multicast channel associated with that analog audio line.

In accordance with aspects of illustrative embodiments, the processor device is configured to operate a field device via the relay contact output when the multicast channel is off-hook and transmitting a digital audio signal.

In accordance with aspects of illustrative embodiments, the processor device is connected to at least one channel isolate input corresponding to a respective one of the one or more analog audio lines. The processor device is configured to disable processing and transmission of digital audio signals and analog audio signals corresponding to that analog audio line in response to receiving a selected input signal at the at least one channel isolate input. For example, the configuration data comprises an isolate input disable parameter that provides the selected input signal.

In accordance with aspects of illustrative embodiments, the processor device is connected to a global disable input switch and configured to disable processing and transmission of digital audio signals and analog audio signals corresponding the one or more analog audio lines in response to activation of the global disable input switch.

In accordance with aspects of illustrative embodiments, the configuration data comprises a redundancy setting, the processor device being configured to operate the audio bridge unit in an idle mode when the redundancy setting indicates that a second audio bridge unit is processing multicast channels and analog audio signals associated with the one or more analog audio lines.

In accordance with aspects of illustrative embodiments, the audio bridge unit further comprises a VLC receiver connected to the page line and configured to receive a VLC tone on the page line and change the audio level of the VLC tone prior to transmission via a multicast channel to at least one IP-based page/party station.

Additional and/or other aspects and advantages of embodiments of the technical solutions will be set forth in the description that follows, or will be apparent from the description, or may be learned by practice of the technical solutions. The technical solutions may comprise devices and methods for operating same having one or more of the above aspects, and/or one or more of the features and combinations thereof. The technical solutions may comprise one or more of the features and/or combinations of the above aspects as recited, for example, in the attached claims.

BRIEF DESCRIPTION OF THE DRAWINGS

The above and/or other aspects and advantages of illustrative embodiments of the technical solutions will be more readily appreciated from the following detailed description, taken in conjunction with the accompanying drawings, of which.

Throughout the drawing figures, like reference numbers will be understood to refer to like elements, features and structures.

DETAILED DESCRIPTION OF ILLUSTRATIVE EMBODIMENTS

Figure 1:
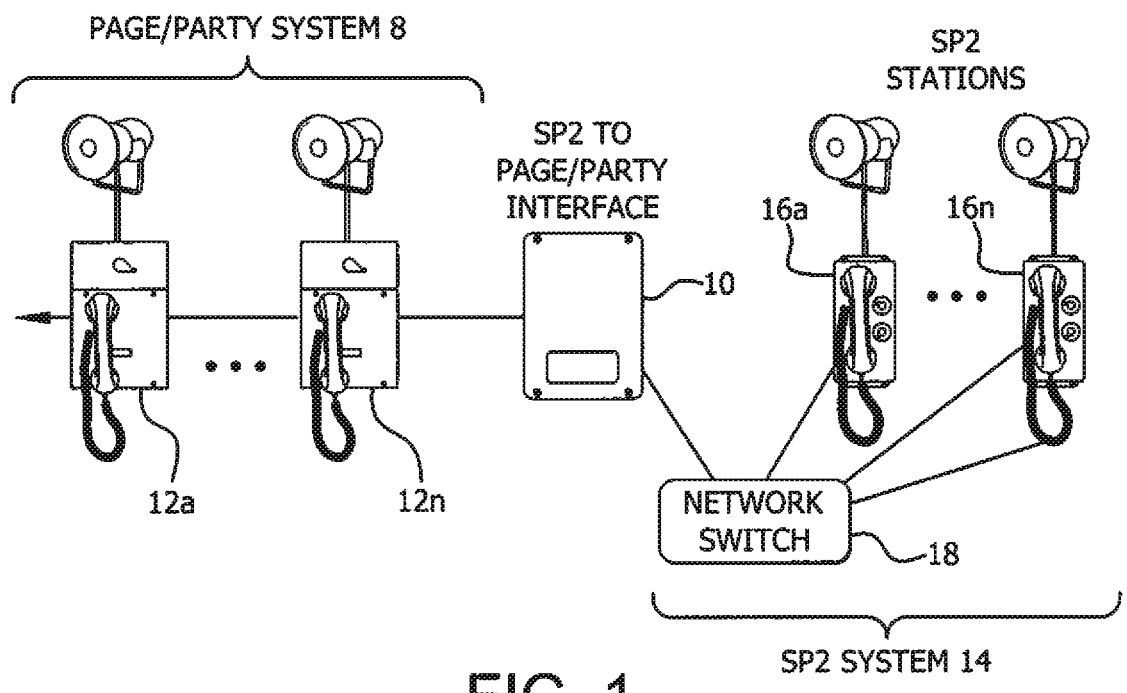
FIG. 1 is a diagram depicting a system wherein an interface comprising an audio bridge constructed in accordance with an illustrative embodiment is deployed between IP-based page party stations and analog page party stations.

Reference will now be made in detail to example embodiments of the technical solutions described herein, which are illustrated in the accompanying drawings. The embodiments described herein exemplify, but do not limit, the technical solutions by referring to the drawings.

An illustrative SP2 system 14 is depicted in FIG. 1. It would be advantageous to users of conventional analog page/party and ICS equipment indicated at 12a through 12n to add VoIP page/party stations 16a through 16n in an SP2 system 14 to their legacy system 8. Doing so would achieve the above-noted benefits of the SP2 system 14 in these legacy page/party systems 8, with the added benefit of facilitating migration from legacy analog page/party stations 12 to VoIP stations 16. As stated above, the SP2 paging and intercom system 14 employs multicast VoIP technology to provide immediate one way paging and full-duplex party line communication. While other systems rely on servers to route calls and administrate the system, the SP2 system 14's use of multicast technology bypasses the need for servers and therefore improves speed, reliability and ease of installation.

In accordance with an illustrative embodiment and with reference to FIG. 1, an audio bridge unit 10 is provided to connect conventional analog page/party units 12a through 12n with VoIP page/party stations 16a through 16n that employ multicast Voice over Internet Protocol (VoIP) technology to support page/party communications between analog page/party stations 12 and VoIP page/party stations 16. As shown in FIG. 1, the audio bridge 10 and VoIP page/party stations 16a through 16n can be connected to a network via a network switch 18. Multiple SP2 stations 16 referenced as stations 16a through 16n in FIG. 1 are connected to a network, each via a single cable (e.g., an Ethernet cable such as a Cat 5 cable). The network can be a single simple network switch or a complex network. The behavior of the network itself is beyond the scope of the illustrated embodiments and is omitted herein for conciseness. The network is generally existing infrastructure available at the location of deployment and need only be set up such that it allows all SP2 stations 16 to route network packets to one another, which includes a necessity for all nodes within the network to handle multicast-based traffic as well as point-to-point traffic.

The audio bridge unit 10 translates SP2 Ethernet multicast channel activity to analog line activity. For example and as described below, a multicast channel from a VoIP page/party station 16 is configured via the audio bridge unit 10 to connect to a PCM channel in a codec that corresponds to a particular one of the party lines (e.g., party lines 1 through 5) or to the page line of an analog page/party station 12.

System Overview

The audio bridge unit 10 converts multiple (e.g., up to six) 33-ohm page or party audio lines to SP2 multicast channels. The audio bridge unit 10 has multiple analog interfaces and each analog interface is assigned to an independent multicast channel on which it will transmit and receive full duplex audio between a legacy page/party unit 12 and one or more VoIP stations 16. The unit 10 provides the ability to configure the multicast group, port and Time to Live (TTL) setting for each analog channel. Each channel is configured to receive multicast streams from a minimum of 10 different sources (e.g., VoIP page/party stations 16) simultaneously, for example, and to prevent transmission of analog audio to the digital domain if there are already 10 streams in use. The number of streams that can be simultaneously supported per channel can vary and depends, for example, on the current configuration and capabilities of the SP2 system 14.

Each analog interface of the audio bridge unit 10 is configured to present an "off-hook" condition to the page/party line when there are one or more streams being received on the associated multicast group and port. In addition, an output contact is provided that will activate at the same time. This contact can have configurable polarity. Each channel is also provided with an individual "isolate" input contact that causes its corresponding channel to disable the connection between "analog" and "digital" streams. The audio bridge unit 10 also comprises a global disable input button. This button operates as a latching momentary input (on/off) to disable all channels. All input contacts have the ability to be disabled in the device configuration. A VLC receiver circuit is provided on channel 1 of the audio bridge unit 10 to allow the unit 10 to alter the level of audio transmitted to the SP2 stream when a 50 kHz Volume Level Control (VLC) tone, for example, is present on the analog page line. The audio bridge unit 10 is also configured with the ability to be placed into a back-up mode where it will pair with a Primary Interface in order to provide "Hot Standby" functionality.

Example Audio Bridge Unit 10 Hardware

Figure 2:
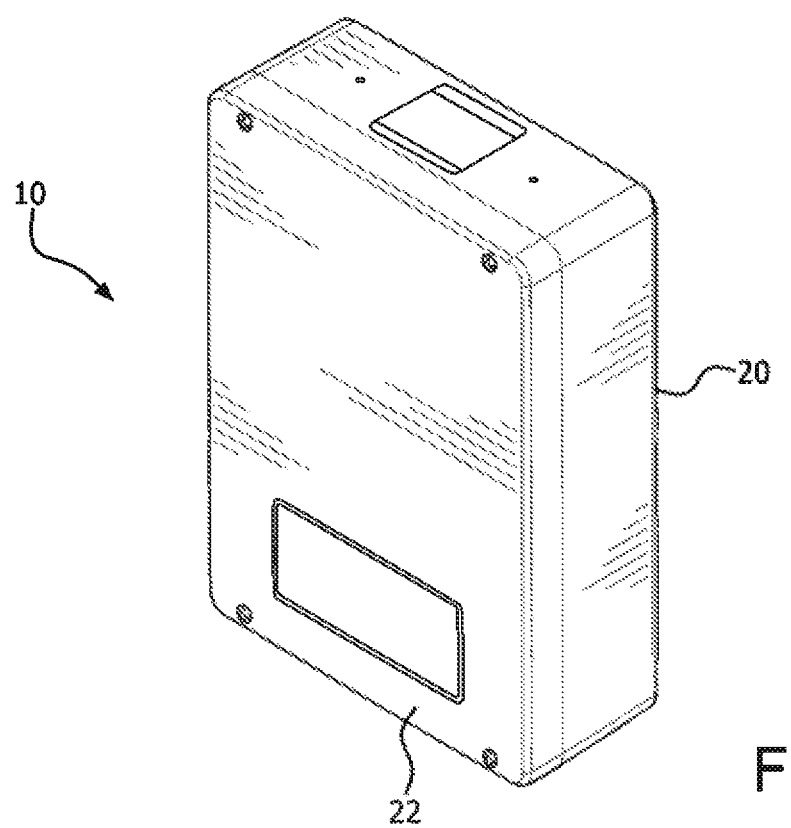
FIG. 2 is a perspective external view of the interface comprising an audio bridge depicted in FIG. 1.
Figure 3:
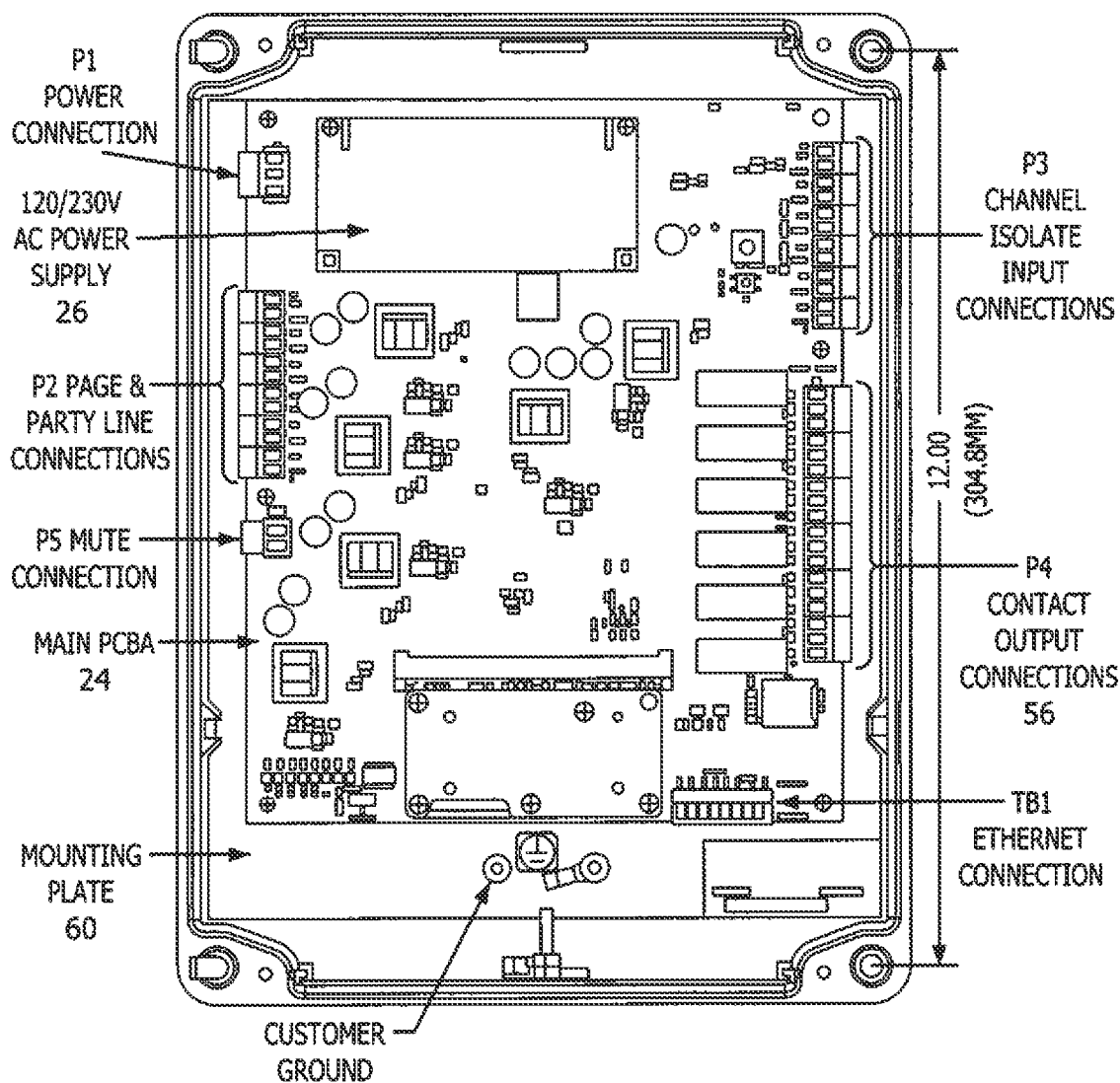
FIG. 3 is a top view of the interface comprising an audio bridge depicted in FIG. 1 but with the cover removed.

As illustrated in FIGS. 2 and 3, the audio bridge unit 10 can be contained, for example, in an indoor, wall mounted enclosure 20 having a lid 22. The audio bridge unit 10 can comprise a main printed circuit board (PCB) 24 mounted within the enclosure 20. The main PCB 24 can have a number of terminal blocks or connectors for wiring power, 33-ohm page/party audio lines, Ethernet, channel isolation inputs and contact outputs as described below. An example hardware block diagram for an audio bridge unit 10 is depicted in FIG. 4.

Figure 4B:
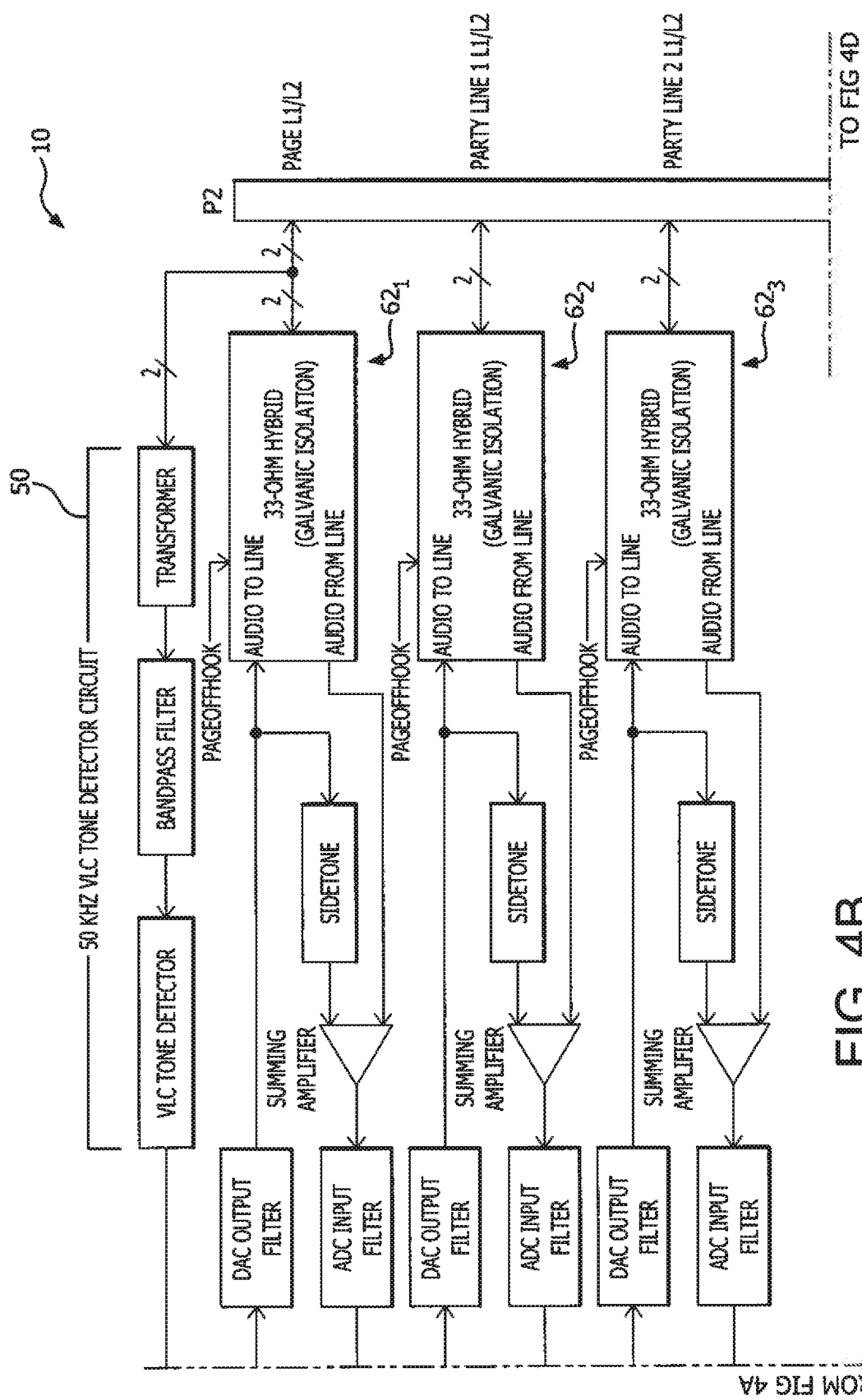
FIG. 4 is a block diagram for the interface comprising an audio bridge depicted in FIG. 1 and constructed in accordance with an illustrative embodiment.
Figure 4C:
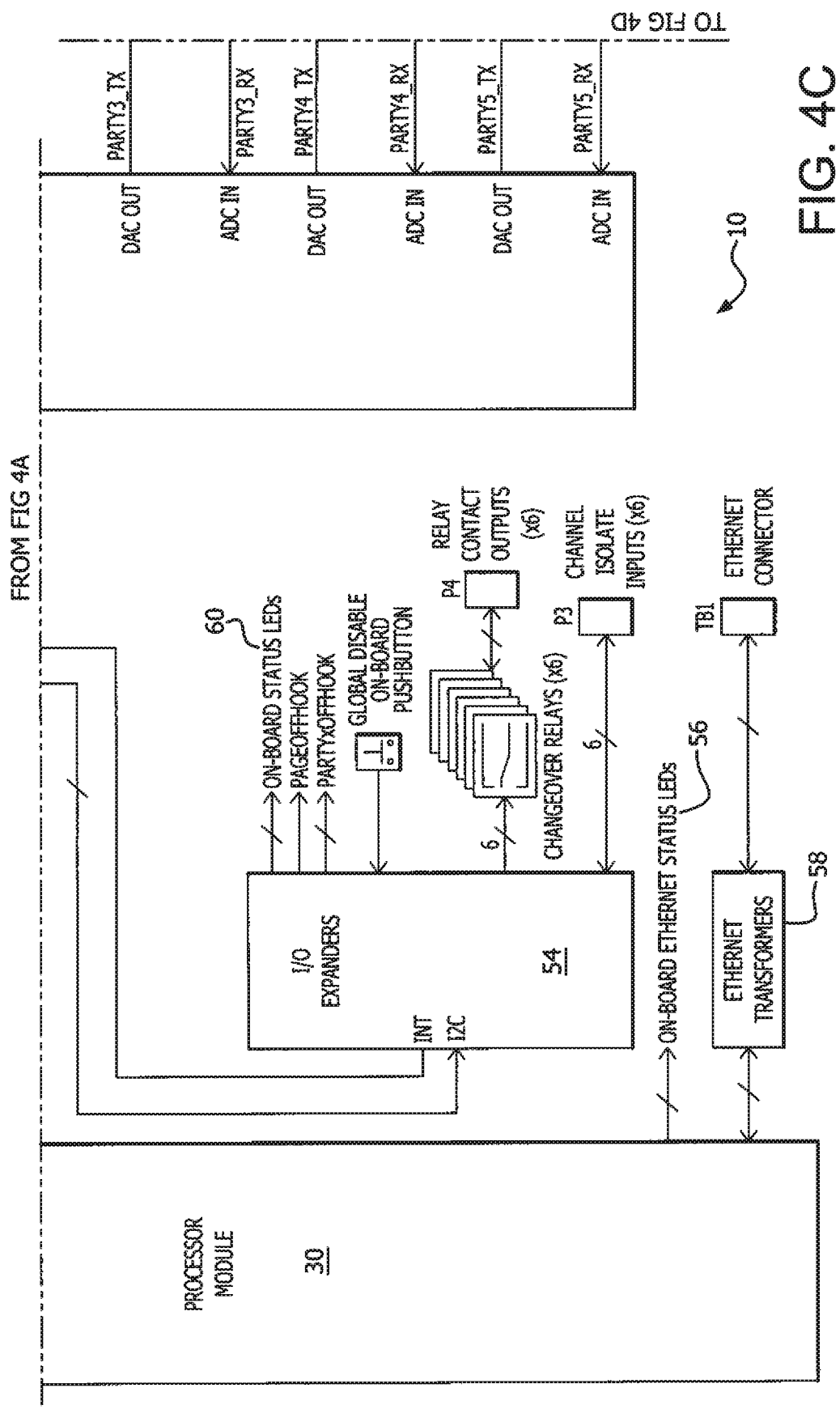
Figure 4D:
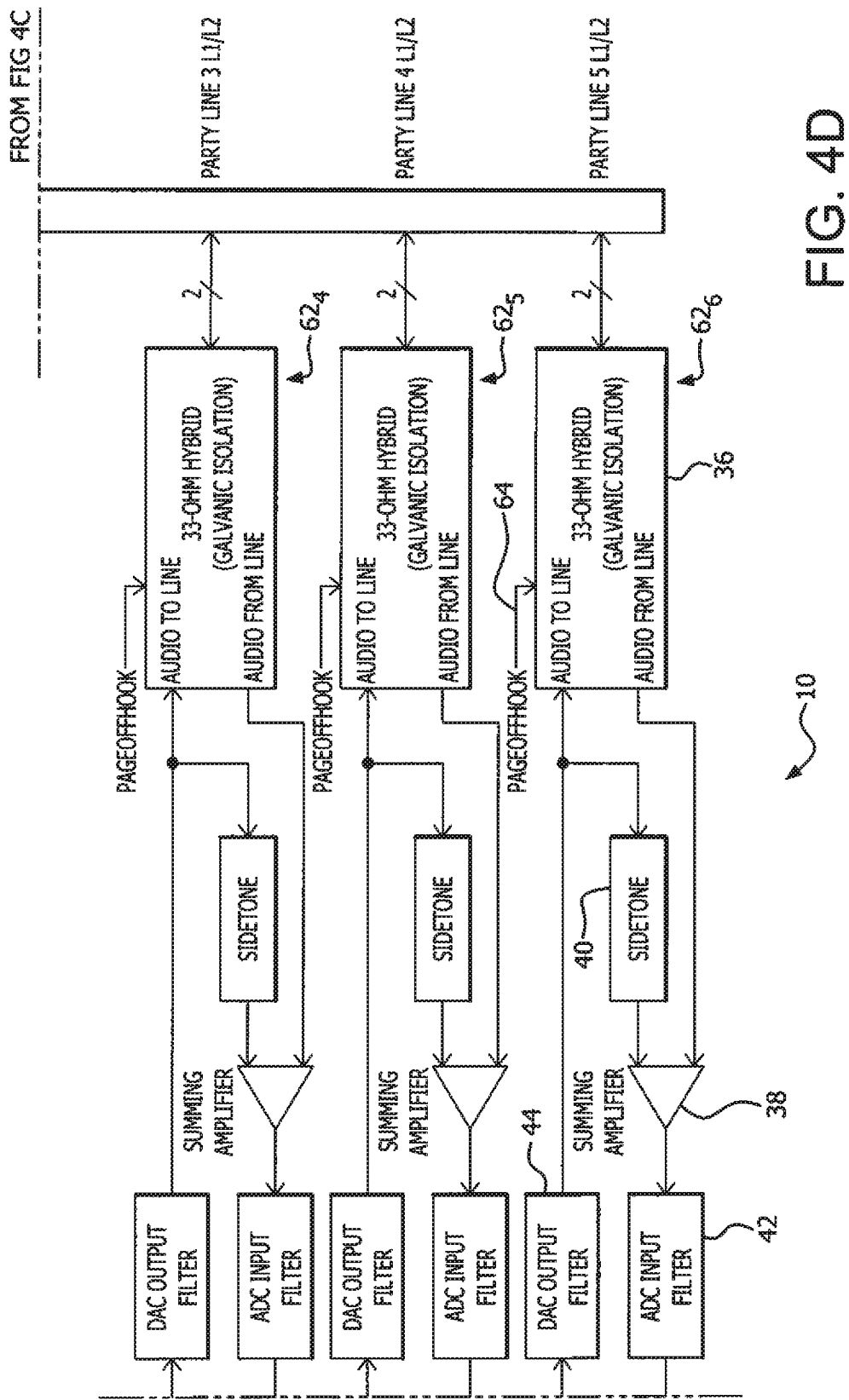

An example of the main PCB 24 is illustrated in FIGS. 3 and 4. The main PCB 24 is provided with a power connection P1 to connect a power line (e.g., 120 VAC) to the power supply 26, which is connected to DC/DC converters 28 to condition the output of the power supply for powering PCB 24 on-board circuit components with designated DC voltage.

The main PCB 24 can be provided with a terminal block receptacle TB1 as shown in FIGS. 3 and 4. The terminal block receptacle TB1 can be configured to receive an 8-position pluggable terminal block that has been connected to wires in a Category 5 or other Ethernet cable extending from a network switch 18 in an SP2 system 14 comprising VoIP page/party stations 16a through 16n.

As described below and with reference to FIG. 4, the audio bridge unit 10 has a plurality of analog audio to IP multicast channel conversion circuits $62_1$ through $62_n$ that receive audio via the page line and party lines from respective page/party stations 12 for conversion to designated IP multicast channels transmitted to VoIP page/party stations 16 and vice versa. The conversion of the audio signals and IP multicast channels is performed, for example, by a multichannel audio codec and analog-to-digital (ADC) device 32 and a processor module 30. The codec and ADC device 32 can be, for example, a pulse code modulation (PCM) codec. Level converters 52 are provided between the codec and ADC device 32 and the processor module 30 to condition the received digitized audio for processing by the processor module 30 for transmission to the VoIP page/party stations 16 via the Ethernet cable. Ethernet transformers 58 are provided between the Ethernet connection TB1 to the Ethernet cable and the processor module 30. A VLC receiver circuit 50 is provided on channel 1 of the audio bridge unit 10 to detect a 50 kHz VLC tone and provide an input to the level converters 52, which allows the audio bridge unit 10 to alter the level of audio transmitted to the corresponding SP2 stream when a 50 kHz VLC tone, for example, is present on the analog page line. The level converters 52 are also configured to receive inputs from and provide outputs to input/output (I/O) expanders 54. The I/O expanders 54 receive inputs from a global disable button and channel isolate inputs. The I/O expanders 54 provide outputs to Ethernet status indicators (e.g., light emitting diodes (LEDs)) 56, to on-board system status indicators (e.g., LEDs) 60, to relay contact outputs, and to output page line off-hook and party line off-hook signals 64 for corresponding ones of the analog page line and party lines from the page/party system 8.

As stated above, the audio bridge unit 10 converts audio lines (e.g., 33-ohm audio lines) to IP multicast channels using respective analog audio to IP multicast channel conversion circuits indicated generally at $62_1$ through $62_n$ in FIG. 4. The audio bridge unit 10 can be configured to convert six analog audio lines (e.g., one page line and five party lines) into IP multicast channels and vice versa using six independent analog audio to IP multicast channel conversion circuits 62, but it is understood that the audio bridge unit 10 can have a different number of conversion circuits 62 to perform audio conversion for a corresponding number of audio lines. Each conversion circuit 62 comprises, for example, an audio line interface 36 connected to each audio line at a terminal block P2, a sidetone supply 40, a summing amplifier 38, an analog to digital converter (ADC) input filter 42, a digital to analog converter (DAC) output filter 44, and an off-hook input 64, as shown in FIG. 4.

A terminal block P2 or other connector device provides analog telephone line connections for each of the page line and the party lines 1 through 5 from the page/party system 8, as indicated in FIGS. 3 and 4, although different numbers of page and/or party lines can be used with the audio bridge unit 10. The six page and party lines can be connected to two-position pluggable terminal blocks P2 by bringing a cable (e.g., a Page/Party® 60029 Series System Cable available from GAI-Tronics Corporation) from the page/party system 8 into the enclosure 20 (e.g., via a through hole) and connecting each audio pair corresponding to respective ones of the page and party lines to respective ones of the two-position terminal blocks and then connecting the blocks to a terminal block receptacle P2.

The audio line interface 36 connected to each audio line at the terminal block P2 comprises a hybrid interface in each of the transmit and receive channel of the audio line to isolate the audio so that the received audio in one direction does not affect the transmit audio in the other direction. Received audio from the audio line of a page/party station 12 is provided to an amplifier 38, along with any sidetone 40. Since the sidetone is an unwanted byproduct of driving the digital audio received from a multicast channel to the same analog line that is also used for the source of digitized audio to be transmitted on a multicast channel, it is desirable to eliminate as much of the sidetone as possible (e.g., by filtering it). The output of the amplifier 38 is provided to an ADC input filter 42 at a corresponding page or party line input to the codec and ADC 32. Digitized audio received in a multicast channel from a VoIP page/party station 16 that has been converted to an analog audio signal by the processor module 30 and codec and ADC 32 is filtered by a DAC output filter 44 for the corresponding page line or party line to which the audio is being transmitted. The filtered audio signal is provided to the corresponding audio line interface 36 for that page or party line for transmission to the page/party station 12 designated by the multicast channel to receive the audio signal.

In accordance with aspects of illustrative embodiments, off-hook detection and isolate functions provide for continued operation of legacy page/party stations 12 and other accessories following connection to the audio bridge unit 10. For example, the processor module 30 is configured to detect when one or more streams are being received from the VoIP page/party stations 16 on an associated multicast group and port of the page/party stations 12. The processor module 30 then generates an off-hook input signal 64 that is provided to the hybrid circuit 62 of the page line or respective party line that corresponds to the associated multicast group and port. In addition, an output contact is provided that will activate at the same time. This contact can have configurable polarity (e.g., a settable configuration parameter such as "Invert Isolate Input"). For example, the contact for each of the page and party line channels can be initially closed for inactive state and then be controlled to open and go active when the associated multicast channel is transferring audio. FIGS. 3 and 4 illustrate an example terminal block P4 in the audio bridge unit 10 at which six contact outputs are terminated for respective ones of the page line and the five party lines in the illustrated embodiment. For example, three-position terminal blocks (e.g., normally closed, common, and normally open) are used for each of the six outputs. The outputs in terminal block P4 become active when a digital audio signal is detected (e.g., by the processor module 30) on the associated SP2 audio channel, that is, the corresponding multicast channel for that page or party line of the analog page/party unit 12. These outputs can then be used to actuate field devices when the corresponding multicast channel goes off-hook.

The audio bridge unit 10 is also provided with channel isolation inputs that independently isolate SP2 multicast channel audio from each of the six page/party audio lines in the illustrated embodiment. In other words, each channel is also provided with an individual "isolate" input contact that causes its corresponding channel to disable the connection between the "analog" and "digital" streams that are being converted to digital and analog streams, respectively. Activation of an input disconnects the SP2 unit 16 and page/party unit 12 audio signals in the audio bridge unit 10 for that audio channel. For example, with reference to FIGS. 3 and 4, terminal block P3 terminates six channel isolation inputs using a two-position terminal plug (e.g., "IN" and ground signals) for each channel isolation input.

Example Audio Bridge Unit 10 Processes Implemented in Software

The software functionality of the audio bridge unit 10 can be divided, for example, into several separate processes which share configuration and status information using, for example, shared memory such as Portable Operating System Interface for UNIX (POSIX) interprocess communication (IPC) shared memory regions. For example, in accordance with the illustrated embodiment in FIG. 4, there can be six independent channel processes, as well as a configuration interface process, and an optional redundancy interface process.

For example, the processor module 30 is configured to perform a channel process described with reference to FIG. 5 for each of the channels (e.g., channels corresponding to the page line and the five party lines in the illustrated example of FIG. 4). In accordance with an illustrative embodiment, the processor module 30 performs startup operations (block 80) comprising connecting to IPC resources, initializing analog hardware associated with the main PCB 24 (e.g., setting output contacts to initial inactive position, and setting audio input and output levels) and initializing the multicast network socket for which the corresponding channel (i.e., page line or party line) is configured. The processor module 30 then determines if the corresponding channel is enabled (block 82). A number of factors can render a channel non-enabled. For example, the audio bridge unit 10 can have a channel configuration parameter that can be set to enabled or non-enabled. The processor module 30 can also determine if the redundant channel is idle. If the redundant channel is active (i.e., the backup audio bridge unit 10' is controlling channel operation), then the processor module 30 in the primary bridge unit 10 switches its channel process control to an idle mode until control is returned to the primary bridge unit 10. The processor module 30 also determines whether the corresponding channel isolate input is idle, or activated to render the channel inactive. Further, the processor module 30 determines if the global disable input for all page/party channels has been activated, thereby rendering the channel inactive. As described below, the channel can be subject to a redundant interface 10', as described with reference to FIG. 6, which may have rendered the channel inactive.

Figure 5:
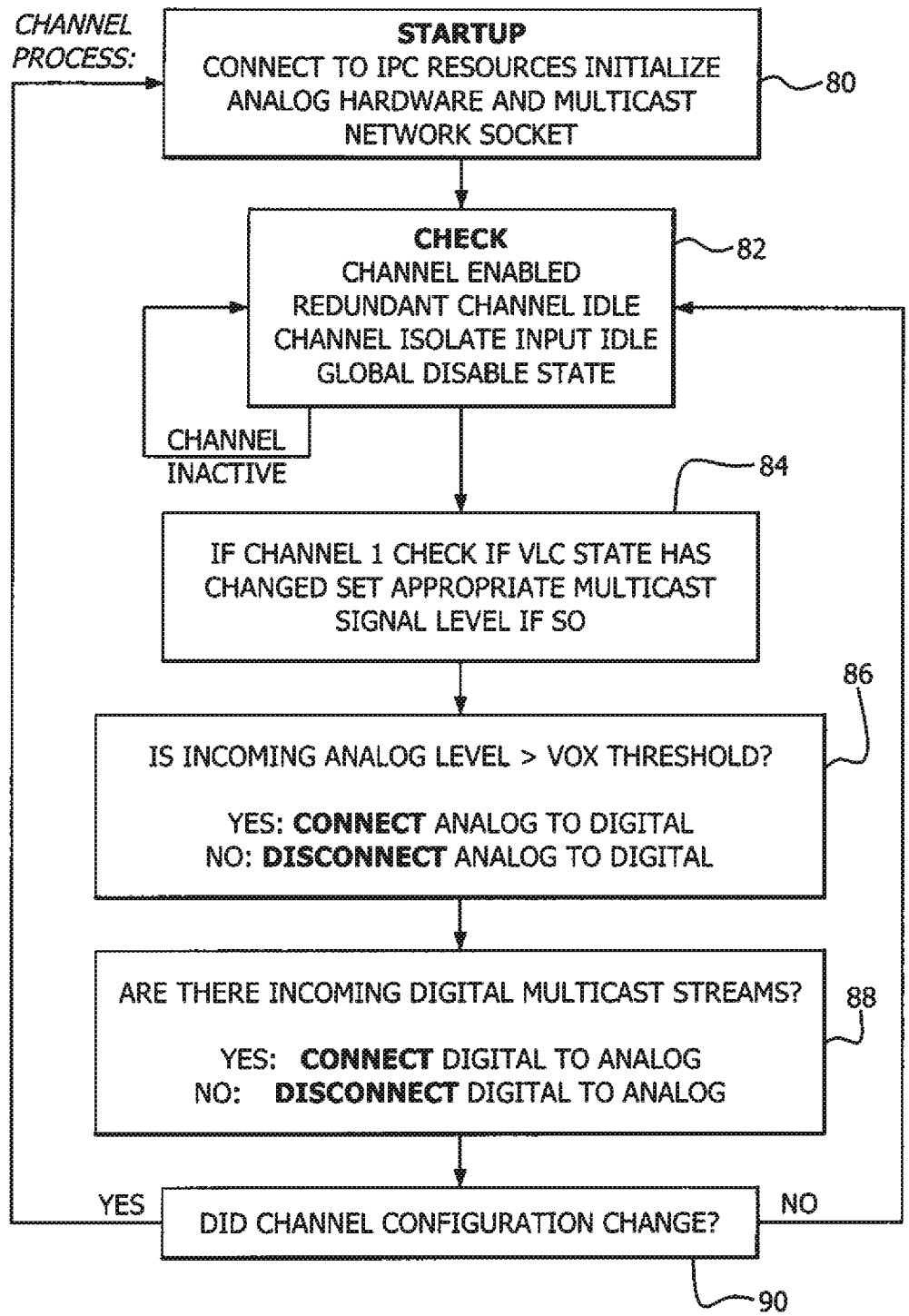
FIG. 5 is a flow chart showing a sequence of operations of the interface comprising an audio bridge depicted in FIG. 1 performing channel audio processing in accordance with an illustrative embodiment.

With continued reference to FIG. 5, once the processor module 30 has determined that the channel is enabled or active (block 82), the processor module 30 continues the channel process by determining if the VLC state has changed and, if so, sets an appropriate multicast signal level (block 84). As stated above, a VLC receiver circuit 50 is provided on channel 1 of the audio bridge unit 10 to detect a 50 kHz VLC tone and provide an input to the level converters 52, which allows the unit 10 to alter the level of audio transmitted to the corresponding SP2 stream when a 50 kHz VLC tone, for example, is present on the analog page line.

With continued reference to FIG. 5, the processor module 30 determines if the incoming analog level from the page/party station 12 exceeds a designated voice switch (VOX) or voice activation threshold (block 86). The VOX threshold can be a configuration parameter as described below. If the incoming analog level does exceed the designated VOX threshold, then the processor module 30 connects the analog stream from the station 12 to a digital stream in a multicast channel for a VoIP station(s) 16 depending on the configuration of that station 12 and line (e.g., page, or party line 1 through 5). If the processor module 30 determines that the incoming analog level does not exceed a designated VOX threshold, then the analog stream is not connected to the digital stream (block 86).

During the example channel process illustrated in FIG. 5, the processor module 30 determines if there are any incoming digital multicast streams from the IP devices 16 (block 88). If so, the processor module 30 converts and connects the incoming digital stream to the corresponding one page or party lines via the codec 32 and DAC output filter 44 of its corresponding analog interface circuit 62. If the processor module 30 determines that there are no incoming digital multicast streams from the IP devices 16, then the digital stream interfaces remain disconnected from the analog circuits $62_1$ through $62_6$.

With reference to block 90 in FIG. 5, the processor module 30 determines if the channel configuration has changed. If so, then the processor module 30 performs startup operations such as those described in connection with block 80, for example. If the channel configuration remains unchanged, then the processor module 30 determines if the channel is enabled per block 82.

Figure 6:
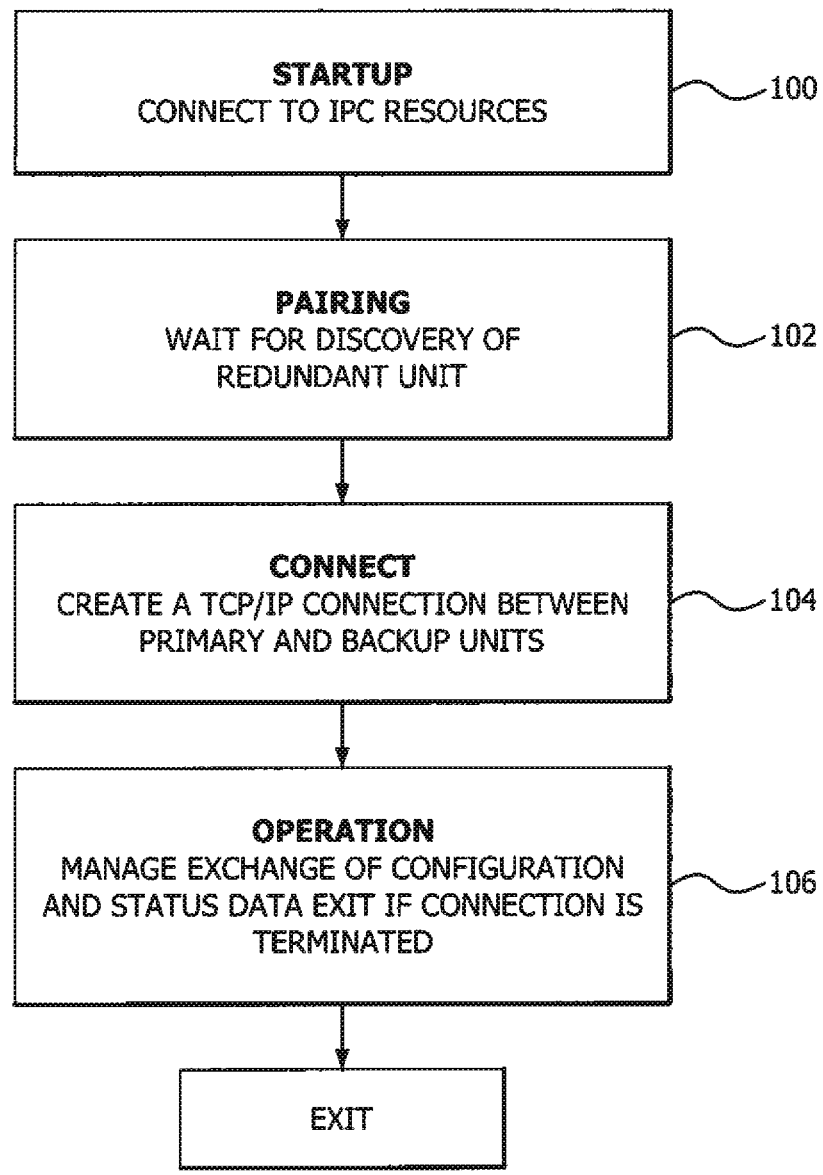
FIG. 6 is a flow chart showing a sequence of operations of the interface comprising an audio bridge depicted in FIG. 1 performing a redundancy interface process in accordance with an illustrative embodiment.

FIG. 6 illustrates an example redundancy interface process performed by the processor module 30. At startup of the redundancy interface process (block 100), the processor module 30 connects to IPC resources. The processor module 30 undergoes discovery and pairing with a redundant audio bridge unit 10' (block 102). Upon completion of pairing, the processor module 30 creates a TCP/IP connection between its primary audio bridge unit 10 and the redundant or backup audio bridge unit 10' (block 104). The audio bridge unit 10 is configured in accordance with the example redundancy interface process to manage and exchange configuration and status data with the redundant or backup audio bridge unit 10' (block 106) via the TCP/IP connection to ensure that both units maintain the same configuration data, even in instances wherein the backup audio bridge unit 10' undertakes the channel processes until control by the primary audio bridge unit 10 is restored. The redundancy interface process is concluded when the TCP/IP connection is terminated.

Example Configuration Parameters for Audio Bridge Unit 10

The following parameters are example configuration parameters for an audio bridge unit 10. The network interface parameters can be one or more of the following:

Interface name—name for audio bridge unit 10;
Address Mode—Static or DHCP;
Control TTL—time to live for control packets;
Control Port—memory address of the control service;
IP Address—client network address;
Netmask—subnet mask, leave blank for DHCP clients;
Default Gateway—IP address of router to other networks, leave blank for DHCP clients;
Primary DNS—primary DNS server, leave blank for DHCP clients;
Secondary DNS—secondary DNS server, leave blank for DHCP clients;
NTP Server—network time protocol server IP address, leave blank for DHCP clients;
Allow HW Disable—Yes or No;
Interface Mode—Standalone, Primary or Backup; and
Redundancy ID—unique name for redundant bridges—configure as identical on the primary and secondary bridges configured for redundancy The channel configuration parameters can be one or more of the following:

Channel Name—name for the connected audio channel;
Enabled—Yes or No;
Multicast Group—multicast IP address for the audio channel;
Multicast Port—multicast service port address for the audio channel
Multicast L—time to live for multicast network traffic;

Analog VOX Threshold (mV)—signal voltage where the VOX circuit picks up or other voice activation is initiated (1-100 mV);

Analog Output Level——-12 to 12 dB gain;

Digital Output Level——-12 to 12 dB gain;

VLC Enabled—Yes or No;

Digital VLC Level—volume level for VLC controlled audio;

Invert Off-hook Contact—Yes or No;

Isolate Input Enable—Yes or No;

Invert Isolate Input—Yes or No;

Channel Direction—Bi-Directional, Digital to Analog, Analog to Digital, or Isolated; and Full Duplex—Yes or No, for single or bi-directional audio; set to No for page line audio channels.

Configuration parameters for an analog page/party station or telephone 12 to interface with VoIP stations 16 via the audio bridge unit 10 can be downloaded and stored locally, or entered by a user locally to the unit 10 via a device interface, or entered by a user or system administrator via a web-based configuration interface. The configuration interface or file allows a system administrator or user to create and/or obtain a configuration profile for the audio bridge unit 10 that operates as a digital model of the analog page/party station or telephone 12 to translate SP2 Ethernet multicast channel activity to analog line activity and vice versa. A web-based configuration interface has the advantages of providing convenient access to the configurable parameters of the unit 10 and can store configuration setting changes for use by the other processes of the unit.

No user interaction is needed after the audio bridge unit 10 is installed and configured. The audio bridge unit 10 is equipped with indicators to provide indication of its operation. For example, eight status LEDs can be provided, that is, respective LEDs for each of the six page and party lines that indicate activity on the line, an LED that is one if the global disable button is inactive, and a status LED which serves as a heartbeat indicator by blinking every few seconds to inform a user that the unit 10 is powered and operational. Indicators can also be provided on the main PCB 24 to show Ethernet status, e.g., a blinking LED operable when the unit 10 is sending and/or receiving packets on the Ethernet network, and separate LEDs indicating healthy 1000 Mb connection link and 100 Mb Ethernet link, respectively.

It is to be understood that more than one audio bridge 10 can be used. In other words, SP2 groups can be configured to talk to different audio bridges 10.

It will be understood by one skilled in the art that this disclosure is not limited in its application to the details of construction and the arrangement of components set forth in the following description or illustrated in the drawings. The embodiments herein are capable of other embodiments, and capable of being practiced or carried out in various ways. Also, it will be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings. Further, terms such as up, down, bottom, and top are relative, and are employed to aid illustration, but are not limiting.

The components of the illustrative devices, systems and methods employed in accordance with the illustrative embodiments of the technical solutions can be implemented, at least in part, in digital electronic circuitry, analog electronic circuitry, or in computer hardware, firmware, software, or in combinations of them. These components can be implemented, for example, as a computer program product such as a computer program, program code or computer instructions tangibly embodied in an information carrier, or in a machine-readable storage device, for execution by, or to control the operation of, data processing apparatus such as a programmable processor, a computer, or multiple computers. A computer program can be written in any form of programming language, including compiled or interpreted languages, and it can be deployed in any form, including as a standalone program or as a module, component, subroutine, or other unit suitable for use in a computing environment. A computer program can be deployed to be executed on one computer or on multiple computers at one site or distributed across multiple sites and interconnected by a communication network. Also, functional programs, codes, and code segments for accomplishing illustrative embodiments of the technical solutions can be easily construed as within the scope of the technical solutions by programmers skilled in the art to which the technical solutions pertain. Method steps associated with the illustrative embodiments of the technical solutions can be performed by one or more programmable processors executing a computer program, code or instructions to perform functions (e.g., by operating on input data and/or generating an output). Method steps can also be performed by, and apparatus of the illustrative embodiments can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example, semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the technical solutions.

The various illustrative logical blocks, modules, and circuits described in connection with the embodiments disclosed herein may be implemented or performed with a general purpose processor, a Digital Signal Processor (DSP), a system on chip (SOC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in the remote station, Electronic medical device, a server, or a combination thereof. In the alternative, the processor and the storage medium may reside as discrete components in a user terminal.

The previous description of the disclosed embodiments is provided to enable any person skilled in the art to make or use illustrative embodiments of the technical solutions. Various modifications to these embodiments will be readily apparent to those skilled in the art, and the generic principles defined herein may be applied to other embodiments without departing from the spirit or scope of the technical solutions. Thus, the technical solutions are not intended to be limited to the embodiments shown herein but is to be accorded the widest scope consistent with the principles and novel features disclosed herein.

The above-presented description and figures are intended by way of example only and are not intended to limit the technical solutions described herein in any way except as set forth in the following claims. It is particularly noted that persons skilled in the art can readily combine the various technical aspects of the various elements of the various illustrative embodiments that have been described above in numerous other ways, all of which are considered to be within the scope of the technical solutions.

The invention claimed is:

1. An audio bridge unit to connect each analog page/party station among a plurality of analog page/party stations to one or more of a plurality of Internet-Protocol (IP)-based page/party stations, the audio bridge unit comprising:
   an analog telephone interface comprising a plurality of analog audio line interfaces for corresponding ones of each of a plurality of analog audio lines, the plurality of analog audio lines comprising at least a page line and a plurality of party lines connecting the plurality of analog page/party stations together, each analog page/party station being configured to receive analog audio on the page line for output via a speaker and to receive and transmit analog audio on a selected one of a plurality of party lines provided among the plurality of analog audio lines, each of the plurality of party lines being configured to receive and transmit analog audio from multiple users using the same party line from different page/party stations to engage in conversation via that same party line, the different pane/party stations being chosen from the plurality of analog page/party stations and the plurality of IP-based stations;
   an Ethernet interface, the plurality of IP-based stations being connected via an Ethernet link and configured to receive and transmit digital audio on multicast channels assigned to respective ones of the plurality of analog lines, the Ethernet interface being configured to connect to the Ethernet link;
   a memory device, the memory device comprising configuration data, the configuration data comprising multicast channel parameters, the multicast channel parameters designating respective ones of the multicast channels assigned to corresponding ones of the plurality of analog audio lines to configure analog channels for respective ones of the page line and the plurality of party lines;
   a processor device configured to process received analog audio from the one or more of the plurality of analog audio lines into digital audio transmit signals and transmit the digital audio transmit signals to one or more of the IP-based stations via corresponding ones of the multicast channels in accordance with the configuration data, and to process received digital audio from the multicast channels into analog audio transmit signals and transmit the analog audio transmit signals to the corresponding ones of the plurality of analog audio lines in accordance with the configuration data, each of the analog channels corresponding to respective ones of the plurality of party lines being configured via the configuration data to generate the audio output from the multiple users of the plurality of IP-based stations with incoming digital multicast streams comprising a multicast channel assigned to that analog channel; and
   an enclosure configured to contain the analog telephone interface, the Ethernet interface, the memory device and the processor device.

2. The audio bridge unit of claim 1, further comprising conversion devices for respective ones of the plurality of analog audio lines, each conversion device being configured to be connected between a corresponding one of the plurality of analog audio lines, and one of the processor device and a coder-decoder (codec) connected to the processor device, each conversion device being configured to convert the received analog audio from the corresponding analog audio line into digital audio signals, the processor device being configured to provide the digital audio signals to corresponding multicast channels.

3. The audio bridge unit of claim 2, wherein each conversion device comprises:
   at least one isolation device connected to the corresponding one of the plurality of analog audio lines;
   an amplifier and an analog-to-digital (ADC) filter connected to the isolation device and configured to receive analog audio signals therefrom and convert them into digital audio signals for transmission to at least one IP-based page/party station; and
   a digital-to-analog (DAC) filter connected to the isolation device and configured to convert digital audio signals received from at least one IP-based page/party station into analog audio signals and provide the analog audio signals to the isolation device;
   wherein the isolation device is configured to prevent audio signals received in one direction from the corresponding analog audio line from affecting the audio signals transmitted in the other direction from the at least one IP-based page/party station.

4. The audio bridge unit of claim 3, wherein the digital-to-analog (DAC) filter in each conversion device is connected to the codec.

5. The audio bridge unit of claim 1, further comprising status indicators, wherein the processor device is configured to operate the light emitting diode (LED) status indicators to indicate status of respective Ethernet connections of the one or more IP-based stations connected via the Ethernet link.

6. The audio bridge unit of claim 1, wherein the configuration data comprises, for each of the one or more analog audio lines, at least one of a designated multicast group, a designated multicast port, a selected time to live (TTL) setting, analog audio threshold level to be exceeded before analog audio signals are processed into digital audio signals, a Volume Level Control (VLC) enabled parameter, isolate input enabled parameter, channel direction designation, and channel name.

7. The audio bridge unit of claim 1, wherein the processor device is configured to process digital audio signals in multicast streams from a plurality of IP-based page/party stations simultaneously for respective ones of the one or more analog audio lines.

8. The audio bridge unit of claim 7, wherein the processor device is configured to prevent transmission of analog audio signals from a respective one of the one or more analog audio lines to one or more IP-based page/party stations if a designated number of received multicast streams is exceeded.

9. The audio bridge unit of claim 1, wherein the processor device is configured to detect when a multicast stream is being received from one or more of the IP-based page/party stations, generate an off-hook input signal, and provide the off-hook input signal to a corresponding one of the one or more analog audio lines in accordance with the configuration data.

10. The audio bridge unit of claim 1, wherein the processor device is connected to at least one relay contact output corresponding to one of the one or more analog audio lines, the processor device is configured to activate the relay contact output upon detection of a digital audio signal on the multicast channel associated with that analog audio line.

11. The audio bridge unit of claim 10, wherein the processor device is configured to operate a field device different from the plurality of analog page/party stations and the plurality of IP-based page/party stations via the relay contact output when the multicast channel is off-hook and transmitting a digital audio signal.

12. The audio bridge unit of claim 1, wherein the processor device is connected to at least one channel isolate input corresponding to a respective one of the one or more analog audio lines, the processor device is configured to disable processing and transmission of digital audio signals and analog audio signals corresponding to that analog audio line in response to receiving a selected input signal at the at least one channel isolate input.

13. The audio bridge unit of claim 12, wherein the configuration data comprises an isolate input disable parameter that provides the selected input signal.

14. The audio bridge unit of claim 1, wherein the processor device is connected to a global disable input switch and configured to disable processing and transmission of digital audio signals and analog audio signals corresponding the one or more analog audio lines in response to activation of the global disable input switch.

15. The audio bridge unit of claim 1, wherein the configuration data comprises a redundancy setting, the processor device being configured to operate the audio bridge unit in an idle mode when the redundancy setting indicates that a second audio bridge unit is processing multicast channels and analog audio signals associated with the one or more analog audio lines.

16. The audio bridge unit of claim 1, further comprising a Volume Level Control (VLC) receiver connected to the page line and configured to receive a VLC tone on the page line and change the audio level of the VLC tone prior to transmission via a multicast channel to at least one IP-based page/party station.

17. The audio bridge unit of claim 1, wherein the enclosure is wall-mounted.

* * * * *